| [19] | United States Patent | [11] | Patent Number: | 6,103,398 |
|---|---|---|---|---|
| | Norton et al. | [45] | Date of Patent: | Aug. 15, 2000 |

[54] OPTOELECTRONIC DEVICE HAVING AN OVERFILL MATERIAL AND METHOD OF ASSEMBLY

[75] Inventors: Laura J. Norton, Apache Junction; Joseph E. Sauvageau, Chandler, both of Ariz.; Robert K. Denton, Winchester, Va.

[73] Assignee: Motorola, Inc., Schaumburg, Ill.

[21] Appl. No.: 08/861,877

[22] Filed: May 22, 1997

[51] Int. Cl.[7] .................................................. H01L 29/12
[52] U.S. Cl. .............................. 428/620; 385/49; 385/88; 385/94
[58] Field of Search ................................. 385/14, 49, 88, 385/89, 94, 123, 129, 130; 428/620

[56] References Cited

U.S. PATENT DOCUMENTS

| 4,311,726 | 1/1982 | Hacker et al. | 427/54.1 |
|---|---|---|---|
| 5,054,872 | 10/1991 | Fan et al. | 385/130 |
| 5,108,200 | 4/1992 | Nomaka et al. | 385/16 |
| 5,132,384 | 7/1992 | Matsuda et al. | 526/321 |
| 5,249,245 | 9/1993 | Lebby et al. | 385/89 |
| 5,363,468 | 11/1994 | Yoshikawa et al. | 385/145 |
| 5,399,738 | 3/1995 | Wolter et al. | 556/420 |
| 5,414,791 | 5/1995 | Ermer et al. | 385/143 |
| 5,550,941 | 8/1996 | Lebby et al. | 385/49 |
| 5,561,733 | 10/1996 | Ermer et al. | 385/143 |
| 5,650,231 | 7/1997 | Barraud et al. | 428/391 |

*Primary Examiner*—Melvyn I. Marquis
*Assistant Examiner*—D. Aylward
*Attorney, Agent, or Firm*—Rennie W. Dover

[57] ABSTRACT

An optoelectronic device (10) having an overfill material (30) that protects components of the optoelectronic device (10) and a method for assembling the optoelectronic device (10). The optoelectronic device (10) includes a support structure (16) on which an optoelectronic device (12) is mounted. In addition, the optoelectronic device includes a fiber ferrule (13) through which an optical fiber (39) extends. The optoelectronic device (12) and the optical fiber (14) are coated with an overfill material (30).

5 Claims, 2 Drawing Sheets

OPTOELECTRONIC DEVICE HAVING AN OVERFILL MATERIAL AND METHOD OF ASSEMBLY

BACKGROUND OF THE INVENTION

The present invention relates, in general, to semiconductor devices, and more particularly, to optoelectronic semiconductor devices.

Optical communications systems are comprised of optical emission devices coupled to optical detection devices via a plurality of optical fibers. The optical fibers are typically arranged as a bundle of fibers having an optical reception end and an optical emission end. The optical reception and emission ends of the bundle are housed in fiber ferrules with the tips of the fibers protruding from the fiber ferrule. The fiber ferrule at the optical reception end of the bundle is coupled to the optical emission device via an optical interface unit. Likewise, the fiber ferrule at the optical emission end of the bundle is also coupled to the optical detection device via an optical interface unit. Thus, an optical signal from the optical emission device is transmitted to the optical detection device through two optical interface units, two fiber ferrules, and the bundle of optical fibers.

A drawback of these systems is that the optical fibers or the photonic components may become damaged by physical or environmental stresses. For example, the ends of the optical fibers may become scratched or otherwise damaged during operation of the optoelectronic components.

Accordingly, it would be advantageous to have a method and material capable of coupling optoelectronic components together and to support substrates. It would be of further advantage for the method and material to have a low signal loss along an optical signal path and to protect the optoelectronic components from damage by chemical and physical stresses. In addition, it would be beneficial for the method and material to be cost efficient and easily manufacturable.

DETAILED DESCRIPTION OF THE DRAWINGS

Figure 1:
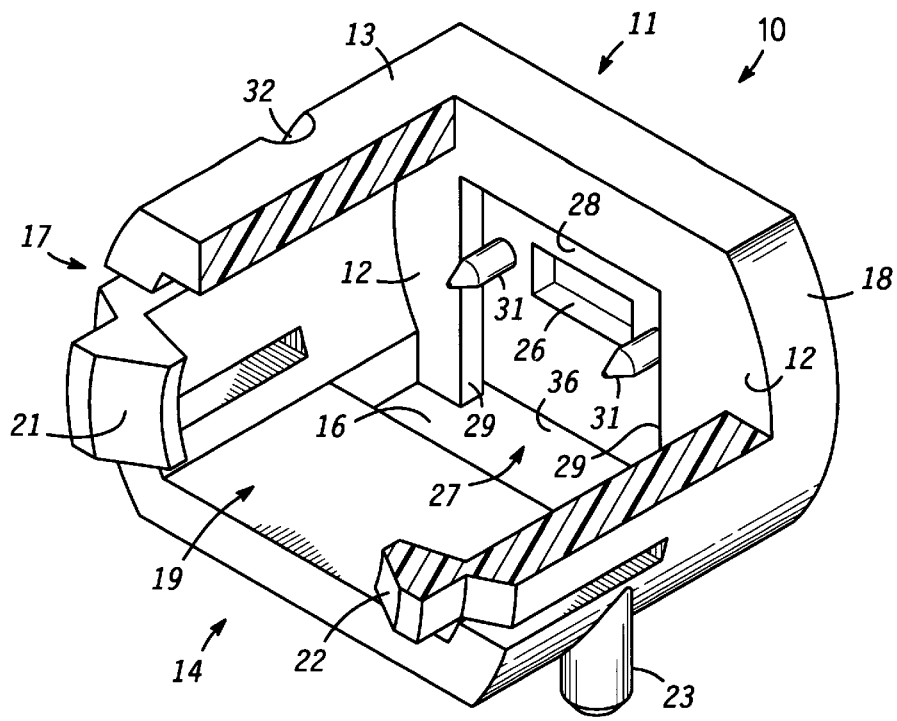
FIG. 1 is a partially cut-away isometric view of a portion of an optoelectronic connector in accordance with an embodiment of the present invention.

Generally, the present invention provides an optoelectronic device, a polymeric coating for the optoelectronic device, and a method of assembling the optoelectronic device. In accordance with an embodiment of the present invention, a polymeric overfill material is provided that can be applied as a monomeric liquid and cured in-situ. In accordance with another embodiment of the present invention, the polymeric overfill material is used to provide protection for an optoelectronic device and an optical fiber. In accordance with yet another embodiment of the present invention, the polymeric overfill material is a potting material used to glue the fiber in place.

Although the terms "optical" and "light" are used herein, it should be understood that these terms include all wavelengths between and including infrared and ultraviolet. It should be further understood that the same reference numerals are used in the figures to denote the same elements.

In accordance with the present invention, a polymeric overfill material is formed by combining an acrylate resin, a difunctional diluent, a monofunctional diluent, a thermal and/or light curing activator, and a stabilizer. More particularly, the concentration of the acrylate resin is between approximately 70 and approximately 99 percent by weight, the concentration of the difunctional diluent is between approximately 0 and approximately 20 percent by weight, the concentration of the monofunctional diluent is between approximately 0 and approximately 10 percent by weight, the concentration of the activator is between approximately 0.1 and approximately 5 percent by weight, and the concentration of the stabilizer is between approximately 0 and approximately 0.4 percent by weight. By way of example, the acrylate resin is an epoxy diacrylate ester, the difunctional diluent is tripropyleneglycol diacrylate, the monofunctional diluent is styrene, and the activator is benzoyl peroxide and/or 1-hydroxycyclohexyl phenyl ketone. In a first embodiment of the present invention, the concentration of the epoxy diacrylate ester is approximately 89 percent by weight, the concentration of the tripropyleneglycol diacrylate is approximately 17 percent by weight, the concentration of the styrene is approximately 10 percent by weight, and the concentration of the benzoyl peroxide is approximately 1 percent by weight. In a second embodiment, the concentration of the epoxy diacrylate ester is approximately 80 percent by weight, the concentration of the tripropyleneglycol diacrylate is approximately 17 percent by weight, the concentration of the styrene is approximately 2 percent by weight, and the concentration of the benzoyl peroxide is approximately 1 percent by weight. Techniques for combining the components of the polymeric overfill material and coating the optoelectronic devices with the polymeric overfill material are known to those skilled in the art. An advantage of the polymeric overfill material in accordance with the present invention is that it can be cured thermally or with light.

FIG. 1 is a partially cut-away isometric view of an optoelectronic connector 10 in accordance with a tape automated bonding (TAB) embodiment of the present invention. Optoelectronic connector 10 includes a base or backwall 11 having a major surface 12 and a plurality of sidewalls 13, 14, 17, and 18 extending from base 11. Sidewalls 13, 14, 17, and 18 cooperate to form a cavity or ferrule receiving region 19. Thus, sidewalls 13 and 14 are opposite each other and sidewalls 17 and 18 are opposite each other. Sidewall 14 has an opening 16 through which an interconnect structure (not shown) extends. Sidewalls 17 and 18 have clips 21 and 22 for securing optoelectronic connector 10 to the ferrule. Optoelectronic connector 10 has an interconnect recess 27 having a floor 28 and sidewalls 29. Preferably, semiconductor receiving area 26 extends further into base 11 than does interconnect recess 27. In addition, a locator pin 23 extends from sidewall 14 at the intersection of sidewall 14 and sidewall 18. Preferably, another locator pin (not shown) extends from sidewall 14 at the intersection of sidewall 14 and sidewall 17. Locator pins 23 mate with locator holes on a substrate (not shown) such as, for example, a printed circuit board, to position optoelectronic connector 10 on the printed circuit board. It should be understood that locator pins 23 are optional features that are useful for positioning optoelectronic connector 10 on a substrate such as, for example, a printed circuit board.

Alignment pins 31 protrude from backwall 28 of interconnect recess 27 and extend above the plane of surface 12.

Figure 2:
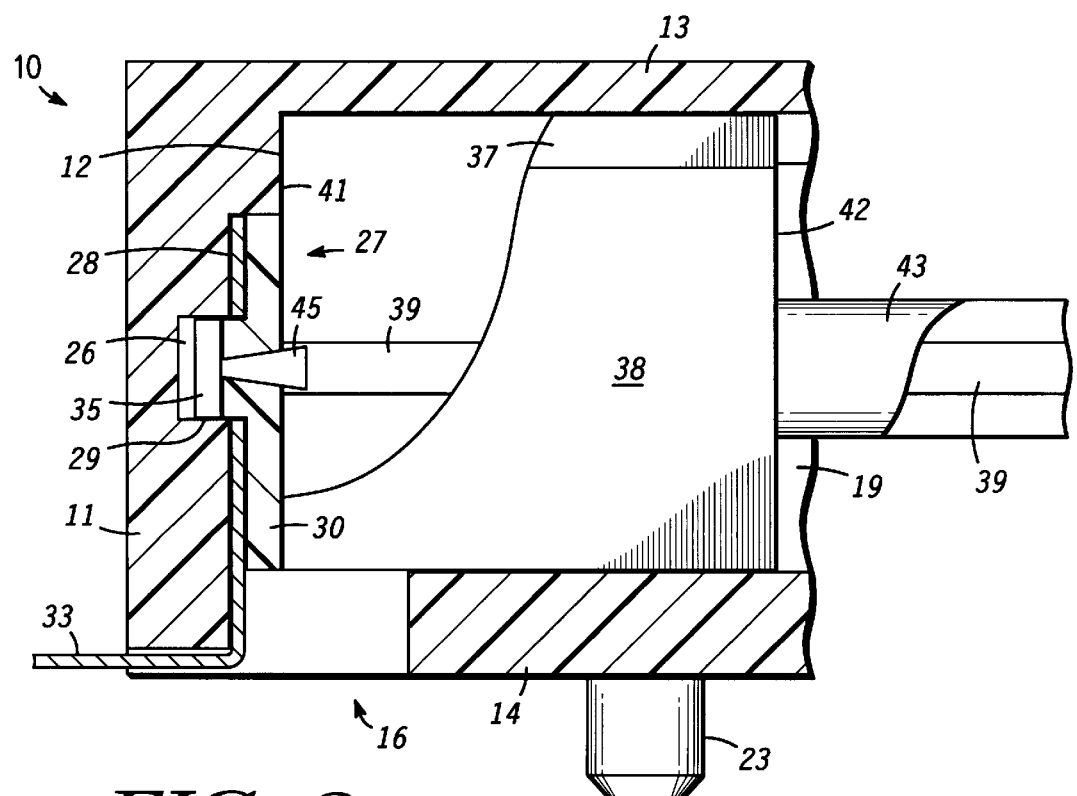
FIG. 2 is a simplified cross-sectional view of a portion of an optoelectronic device in accordance with a tape automated bonding (TAB) embodiment of the present invention.

Alignment pins 31 are alignment features that are used to align an optical fiber to a semiconductor component (shown in FIG. 2). A notch 36 (shown in FIG. 2) adapted to receive a TAB tape is formed in base 11.

Preferably, optoelectronic interconnect 10 is a unitary structure that is formed using an injection molding process. By way of example, optoelectronic interconnect 10 is formed from a molded plastic or other low cost material. The type of material from which optoelectronic interconnect 10 is formed is not a limitation of the present invention. In addition, alignment pins 31 may be formed from the molded plastic material of base 11 or they can be pins that are molded into base 11. When alignment pins 31 are molded into base 11, they may be made from metal, ceramic, or the like.

FIG. 1 further illustrates a pick and place notch 32 that cooperates with pick and place equipment for robotically moving optoelectronic interconnect 10. Notch 32 is an optional feature of optoelectronic interconnect 10.

Now referring to FIG. 2, a cross-sectional view of an optoelectronic connector 10 in accordance with a tape automated bonding (TAB) embodiment of the present invention is illustrated. Optoelectronic connector 10 includes base or backwall 11 having a surface 12 and sidewalls 13 and 14 extending away from base 11. Sidewall 14 has an opening 16 through which an interconnect structure or electrical interconnect 33 extends.

A semiconductor receiving area 26 extends from surface 12 into base 11. The distance semiconductor receiving area 26 extends into base 11 is not a limitation of the present invention. In one example, semiconductor receiving area 26 extends partially into base 11. In another example, semiconductor receiving area 26 is an opening extending completely through base 11. Preferably, semiconductor receiving area 26 is a recess shaped to accept a semiconductor component. In addition, an interconnect recess 27 extends from surface 12 into base 11, wherein interconnect recess 27 surrounds semiconductor receiving area 26. By way of example, interconnect recess 27 is a cavity having a floor 28 and sidewalls 29. Preferably, semiconductor receiving area 26 extends further into base 11 than does interconnect recess 27.

Still referring to FIG. 2, a fiber ferrule or pre-aligner 38 having an optical fiber 39 extending therethrough is also illustrated. Fiber ferrule 38 has a mating surface 41 that contacts surface 12 when fiber ferrule 38 is positioned in cavity 19 and a rear surface 42 through which optical fiber 39 extends. Fiber ferrule 38 also has an opening 40 in mating surface 41. Optical fiber 39 cooperates with opening 40 to receive an optical signal from photonic device 35. The portion of optical fiber 39 extending from rear surface 42 is typically encapsulated by a protective sheath 43 which is often referred to as a pigtail. In addition, fiber ferrule 38 has an alignment guide 37 that mates with a notch (not shown) to provide coarse alignment of optical fiber 39 with photonic device 35. Although not shown, it should be noted that fiber ferrule 38 includes a coupling cavity into which alignment pins 31 (shown in FIG. 1) extend.

In addition, an end of optical fiber 39 is also covered with optoelectronic overfill material 30. Overfill material 30 protects photonic device 35 from mechanical and environmental damage, yet permits transmission of the optical signal between photonic device 35 and optical fiber 39.

FIG. 2 further illustrates the dispersion of an optical signal 45 transmitted from photonic device 35. Optical overfill material 30 focuses the optical signal such that the diameter of optical signal 45 at surface 29 is approximately the diameter of optical fiber 39. Typically, optical fibers such as optical fiber 39 have a diameter of approximately 62.5 $\mu$m. Accordingly, optical overfill material 30 ensures a high coupling efficiency between photonic device 35 and optical fiber 39.

Figure 3:
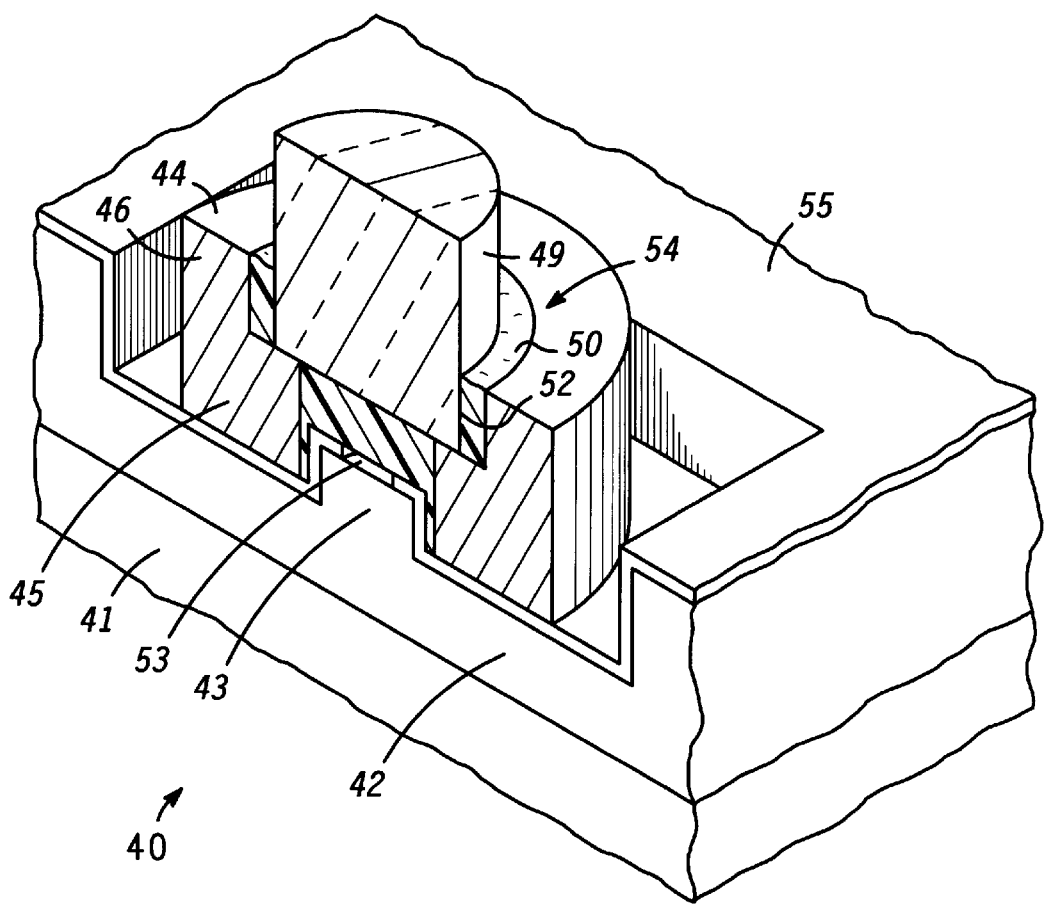
FIG. 3 is a partially cut-away isometric view of an optoelectronic interconnect structure in accordance with another embodiment of the present invention.

FIG. 3 illustrates a partially cut-away isometric view of an electronic component 40 for aligning an optical fiber in accordance with another embodiment of the present invention. Electronic component 40 includes a semiconductor substrate 41 which contains or supports at least one semiconductor device 42. Semiconductor substrate 41 is comprised of semiconductor material including, but not limited to, silicon, gallium arsenide, silicon carbide, indium phosphide, or the like. In particular, semiconductor device 42 is preferably a photonic device such as a vertical cavity surface emitting laser (VCSEL). Semiconductor device or vertical cavity surface emitting laser 42 has a region or portion 43 which radiates light as an optical signal in a direction away from semiconductor substrate 41 and portion 43. Alternatively, semiconductor device 42 can be a light detecting device such as, for example, a photodiode.

After fabrication of the semiconductor device or light emitting device 42, a passivation layer 55 is provided or, preferably, deposited over semiconductor substrate 41 and semiconductor device 42. Passivation layer 55 comprises conventional passivation materials including, but not limited to, silicon nitride, silicon oxynitride, or polyimide. An opening 53 is etched into passivation layer 55 and is aligned over and exposes portion 43 of semiconductor device 42. The optical signal radiating from portion 43 of semiconductor device 42 is not trapped within semiconductor device 42 by passivation layer 55 due to opening 53 which permits the optical signal to radiate away from semiconductor substrate 41.

Next, an alignment feature 44 is fabricated over semiconductor device 42, semiconductor substrate 41, and passivation layer 55. In this embodiment of the present invention, alignment feature 44 has the shape of a collet in order to align an end 52 of an optical fiber or light transmitting structure 49 to portion 43 of semiconductor device 42. Alignment feature or collet 44 has an opening 54 exposing a portion of passivation layer 55 and aligned over or exposing opening 53 of passivation layer 55. Opening 54 is also aligned over or exposes portion 43 of semiconductor device 12. Collet 44 is preferably a right angle circular cylinder but can be a variety of other shapes such as, for example, a tapered structure which is narrower near opening 53 of passivation layer 55 and is wider away from opening 53.

A plating technique can be used to manufacture collet 44 over passivation layer 55. In a preferred embodiment, collet 44 is fabricated using a plating technique as used in a flip chip bump process. In this embodiment, no additional processing steps are required to provide the additional functionality of optical fiber alignment. A seed layer (not shown) can be sputtered over passivation layer 55, and a first patterned photoresist layer (not shown) can be disposed over the seed layer such that portion 45 is plated to a desired height while maintaining the diameter of opening 54. Next, a second patterned photoresist layer (not shown) can be disposed over a region of portion 45, and the plating process is then continued to form portion 46 while maintaining the diameter of opening 54.

After formation of collet 44, end 52 of optical fiber 49 is positioned by or adjacent to collet 44 and inserted into opening 54 of collet 44. Opening 54 is preferably round to provide a more precise alignment of optical fiber 49 to semiconductor device 52. Optical fiber 49 is mechanically glued into collet 44 using overfill material 50 to provide a permanent connection. The formulation of optical overfill material 50 has been described hereinbefore with reference to the first embodiment of the present invention. In addition, optical overfill material 50 can cover an end of optical fiber 49. An advantage of an optoelectronic device in accordance with the present invention is that the end of optical fiber 49 is protected from mechanical stresses by overfill material 30. Optical fiber 49 conducts light or the optical signal away from portion 43 of semiconductor device 42.

Although not shown in FIG. 3, collet 44 can cover a substantial portion of passivation layer 55 to help dissipate heat from semiconductor device 42. However, regardless of its size, collet 44 can serve both as an alignment feature and as a heat sink. Further, semiconductor device 42 can contain a plurality of light emitting regions and a corresponding plurality of collets. Similarly, semiconductor substrate 41 can contain a plurality of semiconductor devices. A further variation of the present invention as embodied in FIG. 3 modifies collet 44 such that its shape is a rectangular trough which enables a plurality of optical fibers to be simultaneously coupled to semiconductor substrate 41.

By now it should be appreciated that an optoelectronic device and a method for optically coupling an optoelectronic fiber to an optoelectronic component have been provided. In accordance with the present invention, an optoelectronic component and an optical fiber are coated with a polymeric overfill material and coupled to each other. Further, the polymeric overfill material can be used as an optical potting material that allows direct mating of a fiber connector with a support structure rather than coupling the fiber connector to the support structure via an optical interface unit.

We claim:

1. An optoelectronic device, comprising:
   a base having a major surface and a semiconductor receiving area;
   a semiconductor mounting structure within the semiconductor receiving area;
   a fiber connector having a mating surface and an opening in the mating surface, wherein the fiber connector houses an optical fiber, and wherein the optical fiber has an end that cooperates with the opening to transmit an optical signal to the semiconductor receiving area; and
   an overfill material that attaches the fiber connector and the semiconductor receiving area together, wherein the overfill material comprises:
      an epoxy diacrylate ester having a concentration of approximately 80 percent by weight;
      tripropyleneglycol diacrylate having a concentration of approximately 17 percent by weight;
      styrene having a concentration of approximately 2 percent by weight;
      benzoyl peroxide having a concentration of approximately 1 percent by weight; and
      a stabilizer, wherein a concentration of the stabilizer is between approximately 0 and approximately 0.4 percent by weight.

2. An optoelectronic device, comprising:
   a base having a major surface and a semiconductor receiving area;
   a semiconductor mounting structure within the semiconductor receiving area;
   a fiber connector having a mating surface and an opening in the mating surface, wherein the fiber connector houses an optical fiber, and wherein the optical fiber has an end that cooperates with the opening to transmit an optical signal to the semiconductor receiving area; and
   an overfill material that attaches the fiber connector and the semiconductor receiving area together, wherein the overfill material comprises:
      an epoxy diacrylate ester having a concentration of approximately percent by weight;
      tripropyleneglycol diacrylate having a concentration of approximately 17 percent by weight;
      styrene having a concentration of approximately 10 percent by weight;
      benzoyl peroxide having a concentration of approximately 1 percent by weight; and
      a stabilizer, wherein a concentration of the stabilizer is between approximately 0 and approximately 0.4 percent by weight.

3. An electronic component for aligning an optical fiber having an end, the electronic component comprising:
   a semiconductor substrate;
   a light emitting device supported by the semiconductor substrate, the light emitting device radiating light from a portion of the light emitting device;
   a collet over the light emitting device, the collet having an opening aligned to the portion of the light emitting device;
   the end of the optical fiber positioned in the opening of the collet to transmit the light from the portion of the light emitting device; and
   a potting material which is a thermosetting resin that attaches the optical fiber to the light emitting device, wherein the potting material comprises:
      epoxy diacrylate resin having a concentration between approximately 70 and approximately 99 percent by weight;
      tripropyleneglycol diacrylate having a concentration of between approximately 0 and approximately 20 percent by weight;
      styrene having a concentration of between approximately 0 and approximately 10 percent by weight;
      benzoyl peroxide having a concentration of between approximately 1 and approximately 5 percent by weight; and
      a stabilizer, wherein a concentration of the stabilizer is between approximately 0 and approximately 0.4 percent by weight.

4. The electronic component of claim 1, wherein the concentration of the epoxy diacrylate resin is approximately 89 percent by weight, the concentration of the tripropyleneglycol diacrylate is approximately 17 percent by weight, the concentration of the styrene is approximately 10 percent by weight, and the concentration of the benzoyl peroxide is approximately 1 percent by weight.

5. A method of assembling an optoelectronic device, comprising the step of coupling a photonic device to an optical fiber with an optoelectronic overfill material that is a thermosetting resin, wherein the optoelectronic overfill material is comprised of:
   an epoxy diacrylate ester having a concentration of approximately 89 percent by weight;
   tripropyleneglycol diacrylate having a concentration of approximately 17 percent by weight;
   styrene having a concentration of approximately 10 percent by weight;
   benzoyl peroxide having a concentration of approximately 1 percent by weight; and
   a stabilizer having a concentration between approximately 0 and approximately 0.4 percent by weight.

* * * * *